United States Patent
Lee et al.

(10) Patent No.: US 7,286,625 B2
(45) Date of Patent: Oct. 23, 2007

(54) HIGH-SPEED CLOCK AND DATA RECOVERY CIRCUIT

(75) Inventors: Jri Lee, Montebello, CA (US); Behzad Razavi, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 366 days.

(21) Appl. No.: 10/616,021

(22) Filed: Jul. 9, 2003

(65) Prior Publication Data

US 2004/0155687 A1 Aug. 12, 2004

Related U.S. Application Data

(60) Provisional application No. 60/445,722, filed on Feb. 7, 2003.

(51) Int. Cl.
*H03D 3/24* (2006.01)
(52) U.S. Cl. .................. 375/376; 375/355; 375/373; 327/2; 327/141; 327/144; 327/147; 327/152
(58) Field of Classification Search ............... 375/376; 331/117; 370/350
See application file for complete search history.

(56) References Cited

U.S. PATENT DOCUMENTS

| | | | | |
|---|---|---|---|---|
| 4,354,274 A | * | 10/1982 | Hughes | 375/376 |
| 5,373,257 A | * | 12/1994 | Shimoda | 331/8 |
| 5,712,580 A | * | 1/1998 | Baumgartner et al. | 327/12 |
| 5,920,556 A | * | 7/1999 | Jorgensen | 370/350 |
| 6,442,225 B1 | * | 8/2002 | Huang | 375/376 |
| 6,560,306 B1 | * | 5/2003 | Duffy et al. | 375/376 |
| 6,690,243 B1 | * | 2/2004 | Henrion | 331/117 R |
| 7,054,374 B1 | * | 5/2006 | Jensen et al. | 375/257 |
| 2003/0020985 A1 | * | 1/2003 | LaGasse et al. | 359/135 |
| 2003/0131155 A1 | * | 7/2003 | Hsu et al. | 710/1 |
| 2003/0198311 A1 | * | 10/2003 | Song et al. | 375/376 |

OTHER PUBLICATIONS

Reinhold et al, "A Fully Integrated 40-Gb/s Clock and Data Recovery IC with 1:4 Demux in SiGe Technology", Dec. 2001, IEEE Journal of Solid-State Circuits, vol. 36, No. 12, pp. 1937-1945.*

Nakamura et al, "A 6 Gbps CMOS Phase Detecting DEMUX Module Using Half-Frequency Clock", Jun. 11-13, 1998, IEEE 1998 Symposium on VLSI Circuits Digest of Technical Reports, pp. 196-197.*

☐☐Cao et al, "OC-192 receiver in standard 0.18 μm CMOS", Feb. 3-7, 2002, 2002 IEEE International Solid-State Circuits Conference Digest of Technical Papers, vol. 1.*

Song et al, "A 4-Gb/s Clock and Data Recovery Circuit Using Four-Phase 1/8 Rate Clock", Sep. 24-26, 2002, ESSCIRC2002 Proceedings of the 28th Solid-State Circuits Conference, pp. 239-242.*

(Continued)

*Primary Examiner*—David C. Payne
*Assistant Examiner*—Linda Wong
(74) *Attorney, Agent, or Firm*—Gates & Cooper LLP

(57) ABSTRACT

A 40-Gb/s clock and data recovery (CDR) circuit incorporates a quarter-rate phase detector and a multi-phase voltage controlled oscillator to re-time and de-multiplex a 40-Gb/s input data signal into four 10-Gb/s output data signals. The circuit is fabricated in 0.18 μm CMOS technology.

20 Claims, 7 Drawing Sheets

OTHER PUBLICATIONS

Wurzer et al, A 40-Gb/s Integrated Clock and Data Recovery Circuit in a 50-GHz fT Silcon Bipolar Technology, Sep. 1999, IEEE Journal of Solid-State Circuits, vol. 34, No. 9,1320-1324.*

Savoj et al, "A 10 Gb/s CMOS Clock and Data Recovery Circuit with Frequency Division", Feb. 2001, 2001 IEEE International Solid-State Circuits Conference, pp. 78-79, 434.*

"A 6Gbps CMOS Phase Detecting DEMUX Module Using Half-Frequency Clock", Nakamura et al, IEEE 1998 Symposium on VLSI Circuits Digest of Technical Papters, pp. 196-197.*

"A 4-Gb/s Clock and Data Recoveyr Circuit Using Four-Phase 1/8-Rate Clock", Song et al, Proceedings of the 28th Solid-State Circuits Conference, Sep. 24-26, 2002 ESSCIRC2002, pp. 239-242.*

"A 10Gb/s CMOS Clock and Data Recovery Circuit with Frequency Detection", Savoj et al, 2001 IEEE International Solid-State Circuits Conference, Digest of Technical Papters, Feb. 2001.*

M. Wurzer et al, "A 40-Gb/s Integrated Clock and Data Recovery Circuit in a 50-Ghz $f_T$ Silicon Bipolar Technology," IEEE Journal of Solid-State Circuits, Sep. 1999, 34:1320-1324.

M. Reinhold et al, "A Fully Integrated 40-Gb/s Clock and Data Recovery IC with 1:4 DEMUX in SiGe technology," IEEE Journal of Solid-State Circuits, Dec. 2001, 36:1937-1945.

J. Cao et al, "OC-192 Receiver in Standard 0.18 μm CMOS," ISSCC Dig. Tech. Papers, Feb. 2002, pp. 250-251.

J. Kim and B. Kim, "A Low Phase-Noise CMOS LC Oscillator with a Ring Structure," ISSCC Dig. of Tech. Papers, Feb. 2000, pp. 430-431.

T. P. Liu, "A 6.5-GHz Monolithic CMOS Voltage-Controlled Oscillator," ISSCC Dig. of Tech. Papers. Feb. 1999, pp. 404-405.

J. E. Rogers and J. R. Long, "A 10-Gb/s CDR/DEMUX with LC Delay Line VCO in 0.18 μm CMOS," ISSCC Dig. of Tech. Papers, Feb. 2002, pp. 254-255.

J. Savoj and B. Razavi, "A 10-Gb/s CMOS Clock and Data Recovery Circuit with Frequency Detection," ISSCC Dig. Tech. Papers, Feb. 2001, pp. 78-79.

M. Danesh et al., "A Q-Factor Enhancement Technique for MMIC Inductors," Proc. IEEE Radio Frequency Integrated Circuits Symp., Apr. 1998, pp. 217-220.

A. Hajimiri and T. H. Lee, "A General Theory of Phase Noise in Electrical Oscillators," IEEE Journal of Solid-State Circuits, Feb. 1998, pp. 179-194.

J. D. H. Alexander, "Clock Recovery from Random Binary Data," Electronics Letters, Oct. 1975, 11:541-542.

B. Razavi et al, "Design Techniques for Low-Voltage High-Speed Digital Bipolar Circuits," IEEE Journal of Solid-State Circuits, Mar. 1994, pp. 332-339.

* cited by examiner

HIGH-SPEED CLOCK AND DATA RECOVERY CIRCUIT

CROSS-REFERENCE TO RELATED APPLICATIONS

This application claims priority under 35 U.S.C. § 119(e) to co-pending and commonly-assigned Provisional Application Ser. No. 60/445,722, entitled "A 40-GB/S CLOCK AND DATA RECOVERY CIRCUIT IN 0.18 MM CMOS TECHNOLOGY," filed on Feb. 7, 2003, by Jri Lee and Behzad Razavi, which application is incorporated by reference herein.

BACKGROUND OF THE INVENTION

1. Field of the Invention

The present invention relates generally to 40-Gb/s data, and in particular, to a 40-Gb/s clock and data recovery circuit in 0.18 µm CMOS technology.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Clock and data recovery (CDR) circuits operating at tens of gigabits per second pose difficult challenges with respect to speed, jitter, signal distribution, and power consumption. Half-rate 40-Gb/s CDR circuits have been implemented in bipolar technology [1,2], but they require 5 V supplies and draw 1.6 to 5 watts of power. (The work in [1] uses an external oscillator and 90° phase shifter.) On the other hand, the recent integration of 10-Gb/s receivers in CMOS technology [3] encourages further research on CMOS solutions for higher speeds, especially if it enables low-voltage, low-power realization. The present invention comprises a design and experimental verification of a 40-Gb/s phase-locked CDR circuit fabricated in 0.18-µm CMOS technology.

BRIEF SUMMARY OF THE INVENTION

A 40-Gb/s clock and data recovery (CDR) circuit incorporates a quarter-rate phase detector and a multi-phase voltage controlled oscillator to re-time and de-multiplex a 40-Gb/s input data signal into four 10-Gb/s output data signals. The circuit is fabricated in 0.18 µm CMOS technology.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1A:
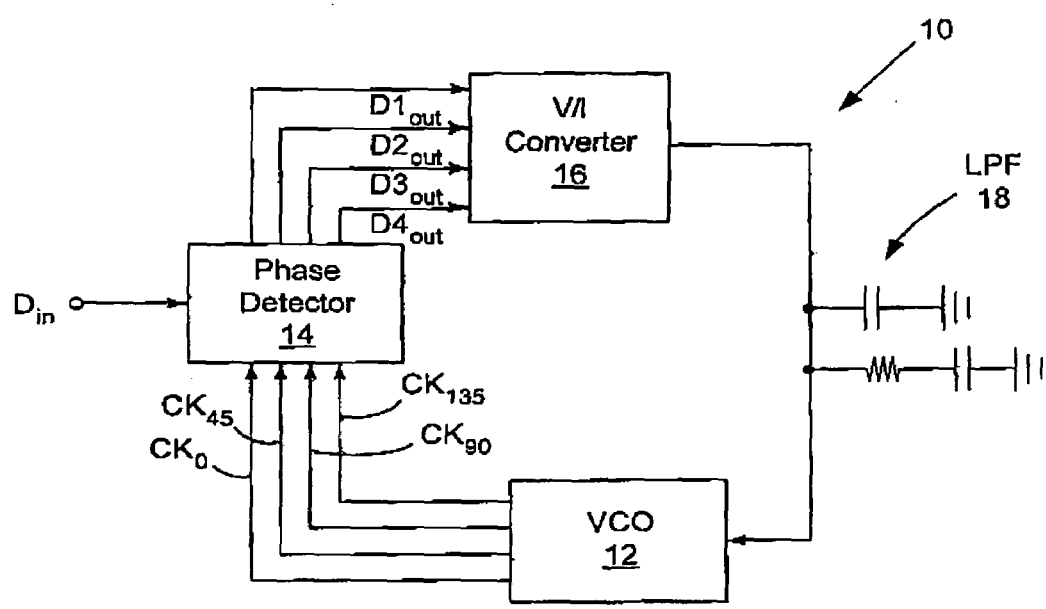
FIG. 1A is a block diagram that illustrates the architecture of a clock and data recovery (CDR) circuit of the preferred embodiment of the present invention.

FIG 1A is a block diagram that illustrates the architecture of a clock and data recovery (CDR) circuit 10 according to the preferred embodiment of the present invention. The CDR circuit 10 includes: (1) a multi-phase voltage-controlled oscillator (VCO) 12 for accepting a control signal and for changing a frequency of a clock signal output from the VCO 12 in response thereto, wherein the VCO 12 outputs a plurality of phases of the clock signal; (2) a quarter-rare phase detector (PD) 14 for sampling an input data signal using the phases of the clock signal received from the VCO 12 and generating a plurality of output data signals in response thereto, wherein each of the output data signals detects an edge or transition in the input data signal and whether the edge is early or late with respect to its corresponding clock signal phase; (3) a Voltage-to-Current (V/I) Convener 16 for converting the output data signals from the phase detector 14 to a control current; and (4) a loop filter (LP) 18 for integrating the control current from the V/I Converter 16 and for outputting the control signal to the VCO 12 in response thereto.

Specifically; the circuit 10 accepts a single 40-Gb/s input data signal $D_{in}$, and re-times and de-multiplexes the input data signal $D_{in}$ into a plurality of 10-Gb/s output data signals $D1_{out}$, $D2_{out}$, $D3_{out}$ and $D4_{out}$. To accomplish this function, the PD 14 uses half-quadrature phases of the clock signal CK provided by the VCO 12 to sample the input data signal $D_{in}$, thereby detecting the edges or transitions in the input data signal $D_{in}$ and determining whether the clock signal CK is early or late. Specifically, four 10-GHz phase offsets $CK_0$, $CK_{45}$, $CK_{90}$ and $CK_{135}$ of the clock signal are output from the VCO 12, wherein adjacent ones of the phase offsets $CK_0$, $CK_{45}$, $CK_{90}$ and $CK_{135}$ of the clock signal are half-quadrature phases, i.e., are offset in phase by 45° as indicated by their subscripts.

Figure 1B:
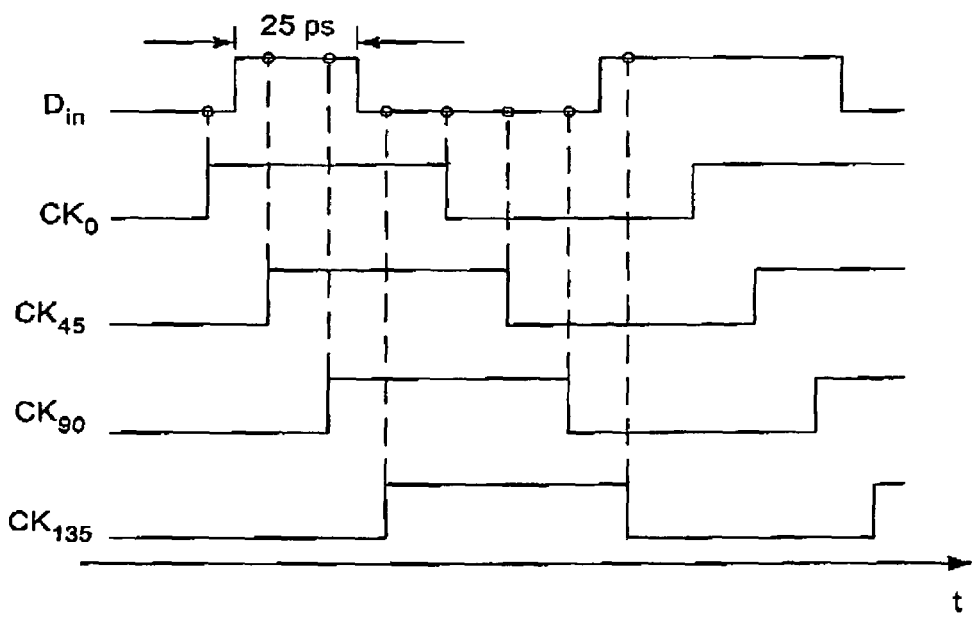
FIG. 1B is a timing diagram that illustrates the operation of the clock and data recovery circuit in the preferred embodiment of the present invention.

FIG. 1B is a timing diagram that illustrates the operation of the CDR circuit 10 in the preferred embodiment of the present invention. The PD 14 uses both the leading and trailing edges of the four 10-GHz phase offsets $CK_0$, $CK_{45}$, $CK_{90}$ and $CK_{135}$ of the clock signal provided by the VCO 12 to sample the input data signal $D_{in}$ every 12.5 picoseconds (ps), in order to detect edges or transitions in the input data signal $D_{in}$, thereby re-timing and de-multiplexing the 40-Gb/s input data signal $D_{in}$ into the four 10-Gb/s output data signals $D1_{out}$, $D2_{out}$, $D3_{out}$ and $D4_{out}$. The PD 14 also determines whether the clock signal CK is early or late. Using this quarter-rate (10-Gb/s) sampling, flip-flops (not shown) in the PD 14 have a hold time that can be four times as long as that required at full-rate (40-Gb/s) operation, but their acquisition speed must still guarantee correct sampling of the input data signal $D_{in}$ in less than 50 ps.

Note that, in the absence of edges or transitions in the input data signal $D_{in}$, the V/I Converter 16 generates no output current, leaving its control line to the LPF 18 and VCO 12 undisturbed. Note also that the circuit 10 is fully differential, except for the control line to the LPF 18 and VCO 12.

B. Components of the Clock and Data Recovery Circuit

1. Voltage-Controlled Oscillator

The speed, jitter, and driving capability required of the oscillator point to the use of an LC realization. A number of multi-phase LC oscillators have been reported. Coupled oscillators [4,5] operate away from the resonance frequency of the tanks so as to create the required phase shift, thus bearing a trade-off between reliability of oscillation and the phase noise [5]. Furthermore, such topologies are prone to oscillation at more than one frequency because they can satisfy gain and phase requirements at multiple frequencies. The multi-phase oscillator in [6] drives transmission lines by a gain stage loaded by resistors, incurring energy loss in each cycle.

Figures 2A, 2B, 2C:
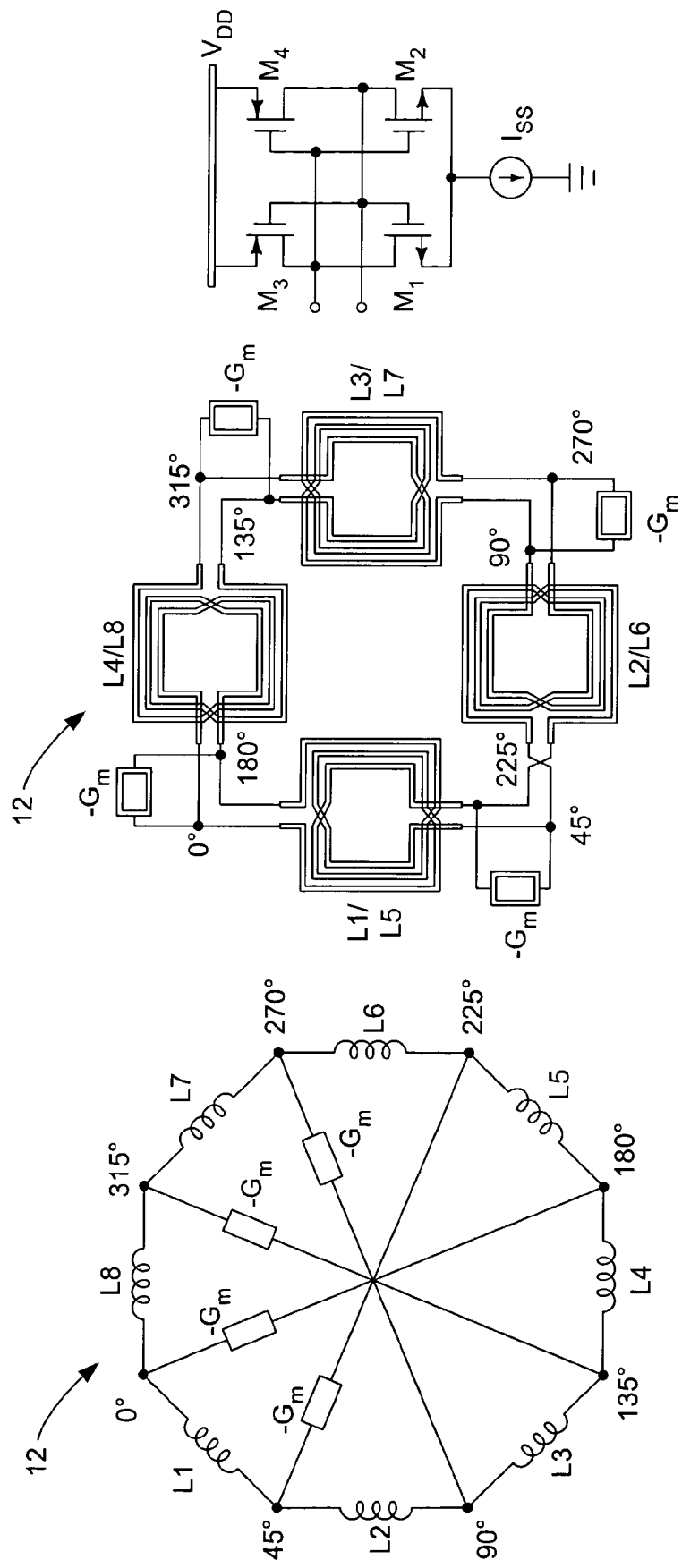
FIG. 2A is a schematic that illustrates a half-quadrature voltage-controlled oscillator according to the preferred embodiment of the present invention.
FIG. 2B is a schematic that illustrates a modification of FIG. 2A.
FIG. 2C is a schematic realization of a $-G_m$ cell according to the preferred embodiment of the present invention.

FIG. 2A is a schematic that illustrates a half-quadrature VCO 12 according to the preferred embodiment of the present invention, FIG. 2B is a schematic that illustrates a modification of FIG. 2A, and FIG. 2C is a schematic realization of a $-G_m$ cell according to the preferred embodiment of the present invention.

The multi-phase VCO 12 introduced here is based on the concept of differential stimulus of a closed-loop transmission line at equally-spaced points. As illustrated in FIG. 2A, the loop circuit of the VCO 12 sustains a phase separation of 180° at diagonally-opposite nodes, providing 45° phase steps in between for the clock signal, wherein the nodes are labeled as 0°, 45°, 90°, 135°, 180°, 225°, 270° and 315°. Unlike the topologies in [5] and [7], this circuit does not operate away from the resonance frequency.

Moreover, the VCO 12 oscillation frequency is uniquely given by the travel time of the wave around the loop. Also, in contrast to the design in [6], the transmission line requires no termination resistors, thereby displaying lower phase noise and larger voltage swings for a given power dissipation and inductor Q.

The topology of FIG. 2A nonetheless necessitates long interconnects between the nodes and their corresponding $-G_m$ cells. However, recognizing that diagonally-opposite inductors L1, L2, L3, L4, L5, L6, L7 and L8 carry currents that are 180° out of phase, the circuit can be modified as shown in FIG. 2B, wherein inductor elements of the VCO 12 are grouped into differential structures L1/L5, L2/L6, L3/L7 and L4/L8, and $-G_m$ cells are placed in close proximity to the nodes of the VCO 12.

Exploiting the higher Q of differential inductors [8], the VCO 12 uses a structure for the $-G_m$ cell as shown in FIG. 2C, thereby shaping the rising and falling edges by the PMOS transistors $M_1$, $M_2$, $M_3$ and $M_4$, and hence lowering the up-conversion of $1/f$ noise [9]. SpectreRF™ simulations indicate that, for a given power dissipation, inductor Q, and frequency of oscillation, the proposed VCO 12 achieves twice the voltage swings and 12 dB lower phase noise than that in [6].

Using the structure of the $-G_m$ cell shown in FIG. 2C, each differential port of the VCO 12 is buffered by an inductively-loaded differential pair of switches $M_1$-$M_3$ and $M_2$-$M_4$. These buffers performing the following: (1) isolate the VCO 12 from the long interconnects to the PD 14 that would otherwise introduce greater uncertainty in the oscillation frequency; (2) generate voltage swings above the supply voltage, thus driving the flip-flops of the PD 14 efficiently; and (3) isolate the VCO 12 from the edges or transitions coupled through the PD 14.

2. Phase Detector

Figure 3B:
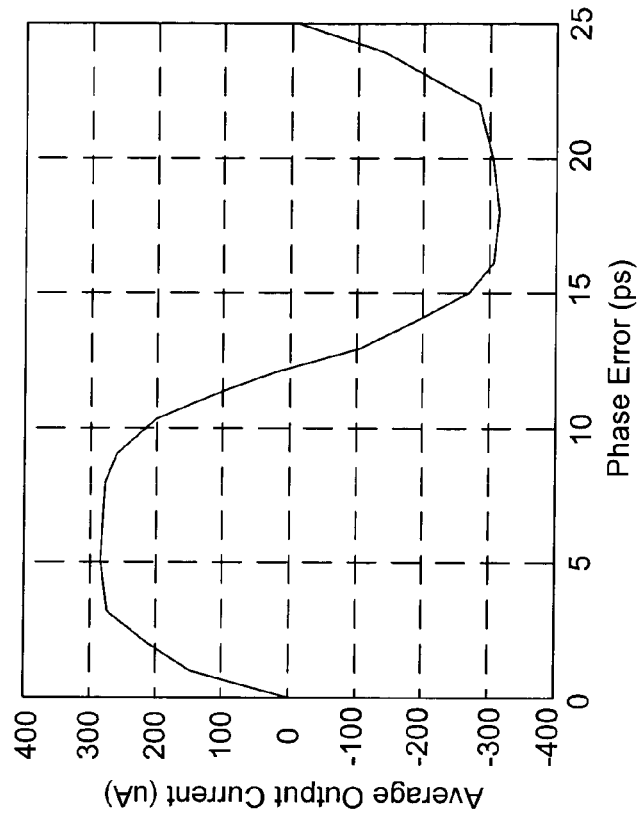
FIG. 3B is a graph that illustrates the characteristic operation of the quarter-rate phase detector and voltage-to-current converter.
Figure 3A:
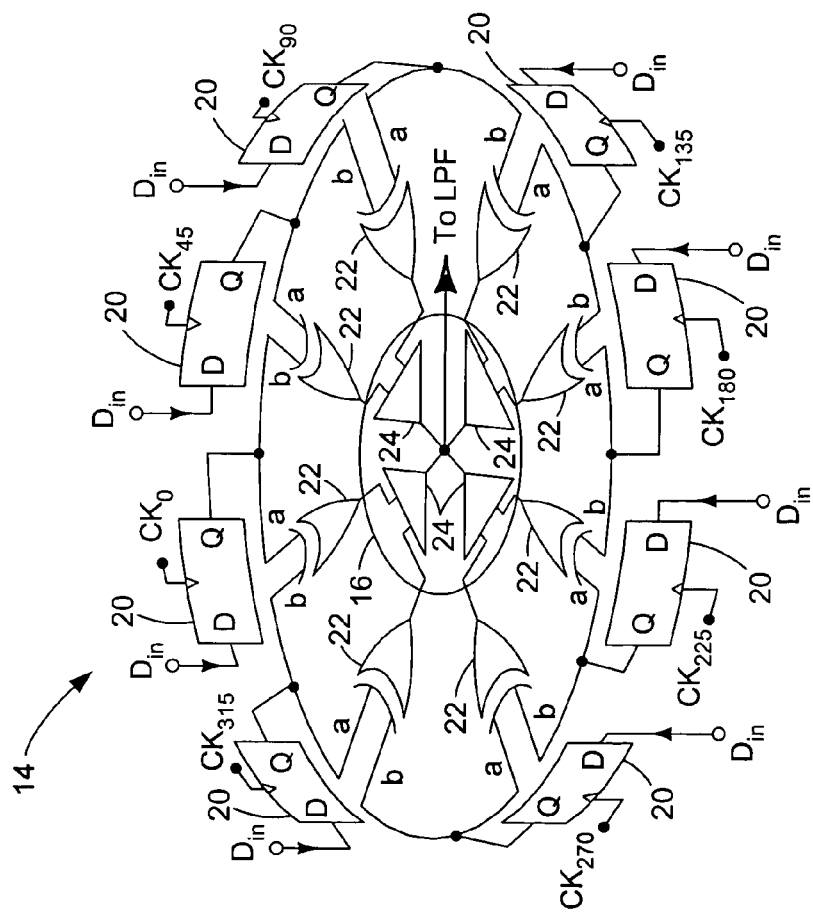
FIG. 3A is a schematic that illustrates a quarter-rate phase detector and voltage-to-current converter according to the preferred embodiment of the present invention.

FIG. 3A is a schematic that illustrates a quarter-rate PD 14 and V/I Converter 16 according to the preferred embodiment of the present invention, and FIG. 3B is a graph that illustrates the characteristic operation thereof. The PD 14 employs eight flip-flops 20 that sample the input data signal $D_{in}$ at 12.5-ps intervals based on the clock signal from the VCO 12 using the phase offsets $CK_0$, $CK_{45}$, $CK_{90}$, and $CK_{135}$, wherein $CK_{180}=\overline{CK_0}$, $CK_{225}=\overline{CK_{45}}$, $CK_{270}=\overline{CK_{90}}$ and $CK_{315}=\overline{CK_{135}}$. The PD 14 also employs eight XOR gates 22 that compare the outputs from adjacent or consecutive flip-flops 20. The V/I Converter 16 employs four Level Converters (LE) 24 that generate a current level from the combined output of the XOR gates 22 as the control line to the LPF 18 and VCO 12.

In a manner similar to an Alexander topology [10], the PD 14 compares every two adjacent or consecutive samples stored by the adjacent or consecutive flip-flops 20 by means of the associated XOR gate 22, which generates a net output current if the two adjacent or consecutive samples are unequal, thereby indicating that an edge or transition has occurred in the input data signal $D_{in}$. When no edges or transitions occur, the flip-flops 20 storing the two adjacent or consecutive samples produce equal outputs, the XOR gate 22 outputs a zero, and the control line from the V/I Converter 16 has a zero current.

The early-late phase detection method used herein exhibits a bang-bang characteristic, forcing the CDR circuit 10 to align every other edge of the clock signal CK with the zero crossings of the input data signal $D_{in}$ under the locked condition. In reality, the meta-stable behavior of the flip-flops 20 leads to a finite PD 14 gain, allowing the clock signal CK edges to sustain some offset with respect to the zero crossings of the input data signal $D_{in}$.

Shown in FIG. 3B is the input/output characteristic of the PD 14 together with the V/I Converter 16, obtained by transistor-level simulations while the circuit 10 senses a 40-Gb/s random stream of the input data signal $D_{in}$ and eight phases of the 10-GHz clock signal CK. For a phase error less than ±2.5 ps, the PD 14 displays a relatively constant gain of 100 µA/ps.

Even though the flip-flops 20 of the PD 14 operate with a 10-GHz clock signal CK, proper sampling of the 40-Gb/s input data signal $D_{in}$ still requires fast recovery from the previous state and rapid acquisition of the present input. To this end, both a wide sampling bandwidth and a short clock signal CK transition time are necessary.

Figures 4A, 4B:
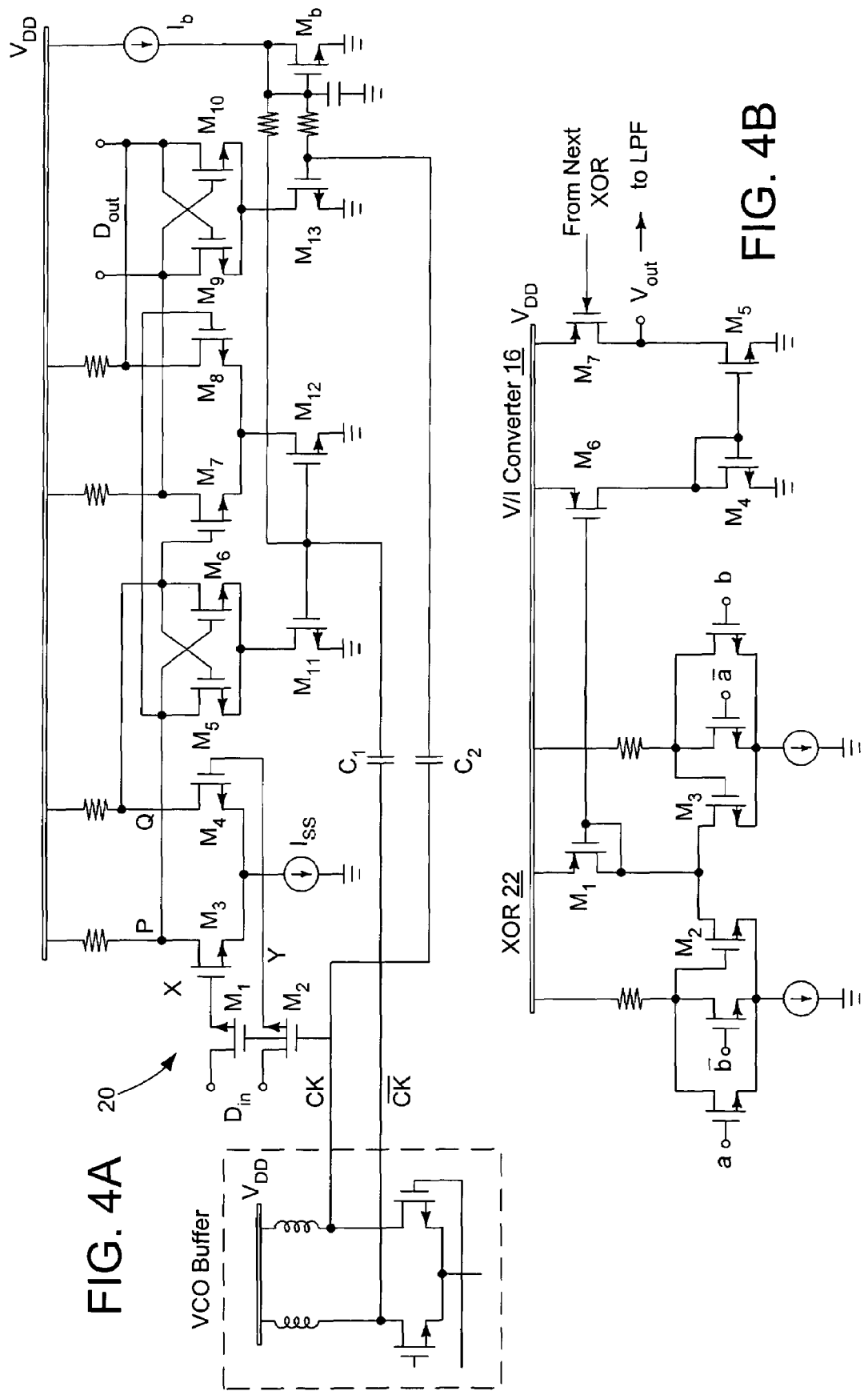
FIG. 4A depicts the master-slave flip-flop used in the phase detector according to the preferred embodiment of the present invention.
FIG. 4B depicts an XOR gate used in the phase detector according to the preferred embodiment of the present invention.

FIG. 4A is a schematic of the master-slave flip-flop 20 used in the PD 14 according to the preferred embodiment of the present invention. The master-slave flip-flop 20 includes switches $M_1$-$M_{13}$ and $M_b$ and capacitors $C_1$-$C_2$. The flip-flop 20 latches input data signal $D_{in}$, using a CK clock signal provided from the VCO 12 buffer, and output data signals $D_{out}$.

NMOS switches $M_1$ and $M_2$ sample the input data signal $D_{in}$ on the parasitic capacitances at nodes X and Y when CK is high. Since the minimum input common-mode (CM) level is dictated by the gate-source voltage of $M_3$-$M_4$ and the headroom required by $I_{SS}$, the sampling switches $M_1$ and $M_2$ experience only an overdrive voltage of 0.5 V even if CK reaches $V_{DD}$, failing to provide fast sampling. This issue is remedied by setting the CM level of CK and CK equal to $V_{DD}$, a choice afforded by the inductively-loaded stages of the VCO 12 buffer. The peak value of CK thus exceeds $V_{DD}$ by 0.8 V, more than doubling the sampling speed of $M_1$ and $M_2$. The large clock swings also minimize the transition times.

With large clock swings available, the current switching in pairs $M_5$-$M_6$, $M_7$-$M_8$ and $M_9$-$M_{10}$ is accomplished by gate control rather than conventional source-coupled steering. The proposed topology offers two advantages: (1) since the tail current source is removed, $M_{11}$-$M_{13}$ can be quite narrower, presenting a smaller capacitance to the VCO 12 buffer; (2) since the drain currents of $M_{11}$-$M_{13}$ are not limited by a tail current source, these transistors experience "class AB" switching, drawing a large current at the peak of the clock swing and providing greater voltage swings and a higher gain in the data path.

FIG. 4B is a schematic of the XOR gate 22 used in the PD, along with the V/I Converter 16 (i.e., the Level Converter 24), according to the preferred embodiment of the present invention. The XOR gate 22 accepts signals a and b as input and includes switches $M_1$-$M_3$, while the V/I Converter 16 accepts the output of the XOR gate 22 (as well as the next XOR gate 22) as input and includes switches $M_4$-$M_7$. The V/I Converter 16 outputs the control line $V_{out}$ to the LPF 18 (and then to the VCO 12).

The XOR gates 22 used in the PD 14 must exhibit symmetry with respect to their two inputs and operate with a low supply voltage. The XOR gate 22 shown in FIG. 4B is a modified version of that in [11], with transistors $M_2$ and $M_3$ forming local positive feedback loops and avoiding the reference voltage necessary in the realization in [11]. The V/I Converter 16 copies the output current of the XOR gate 22, providing nearly rail-to-rail swings for the control line $V_{out}$ to the LPF 18 (and VCO 12).

C. Experimental Results

Figure 5:
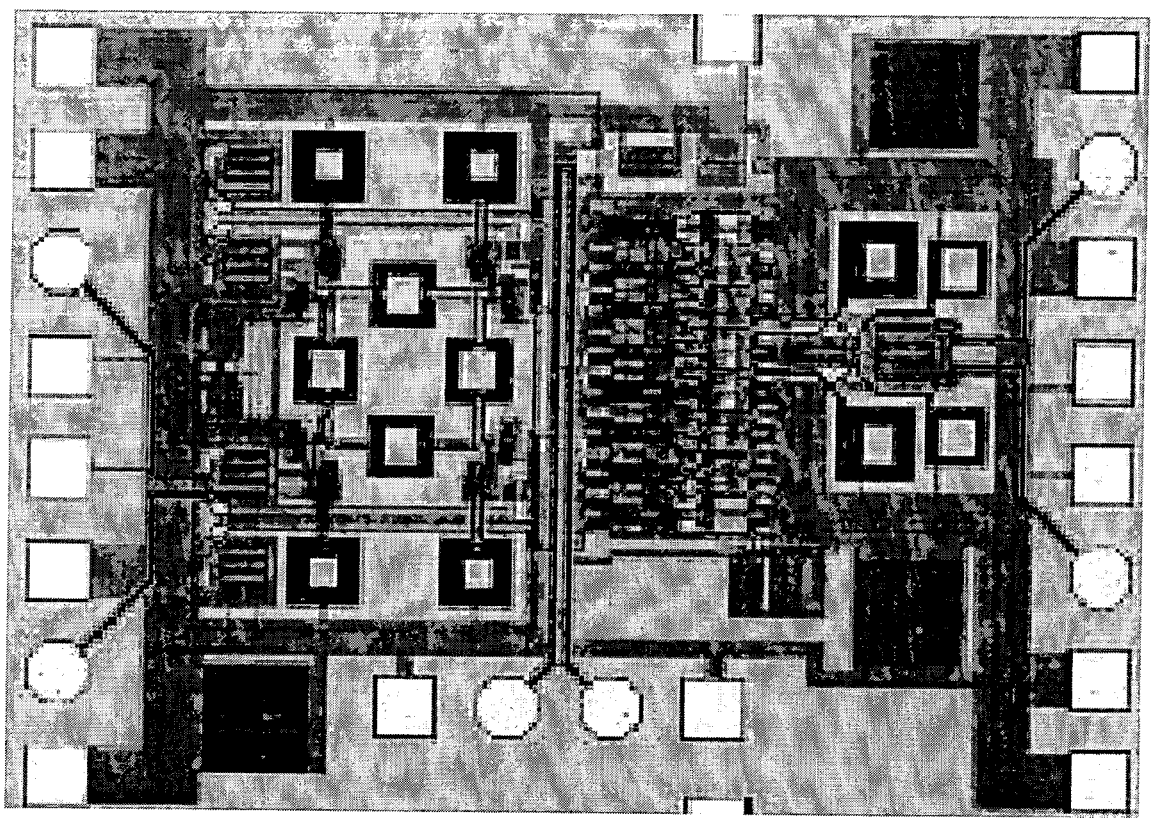
FIG. 5 is a micrograph that shows a photo of a die for the clock and data recovery circuit that has been fabricated in a 0.18 µm CMOS technology.

The CDR circuit 10 of the present invention has been fabricated in a 0.18 μm CMOS technology. FIG. 5 is a micrograph that shows a photo of the die, which measures 1.0×1.4 mm². The circuit is tested on a high-speed probe station with a 40-Gb/s Anritsu™ random data generator providing the input.

Figure 6B:
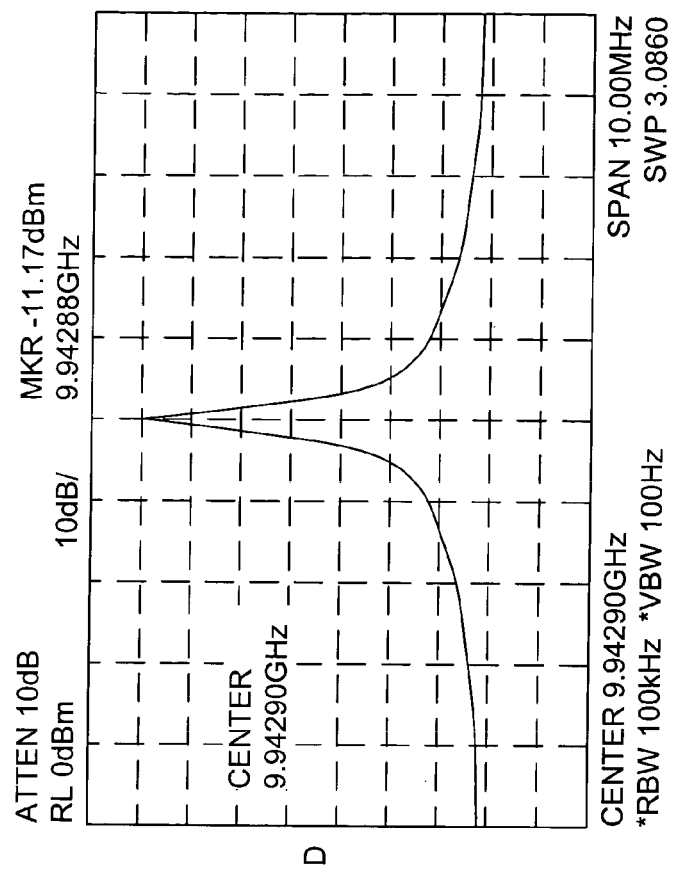
FIG. 6B is a graph showing the free-running spectrum of the voltage-controlled oscillator according to the preferred embodiment of the present invention.
Figure 6A:
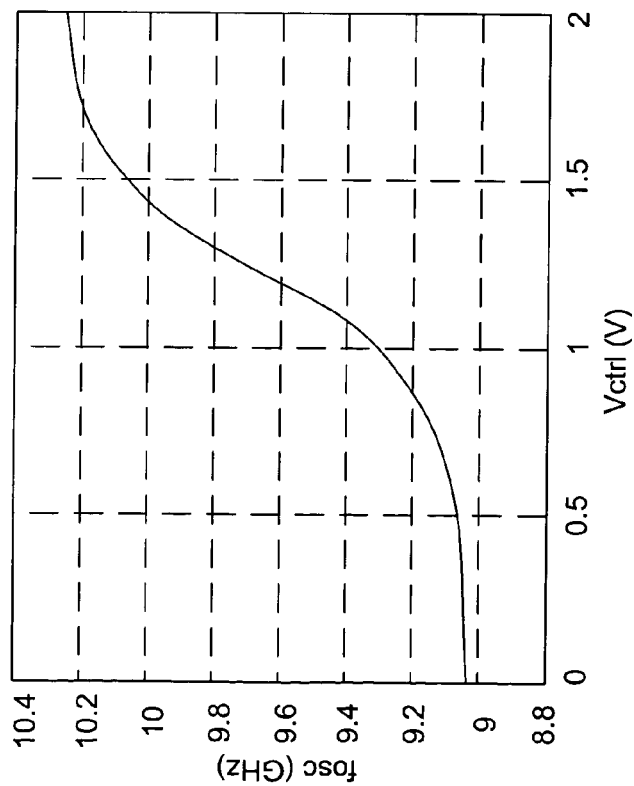
FIG. 6A is a graph showing the tuning range of the voltage-controlled oscillator according to the preferred embodiment of the present invention.

Shown in FIG. 6A is the VCO 12 tuning range and shown in FIG. 6B is the free-running spectrum. The VCO 12 provides a tuning range of 1.2-GHz with a free-running phase noise of −105 dBc/Hz at 1-MHz offset.

Figure 7A:
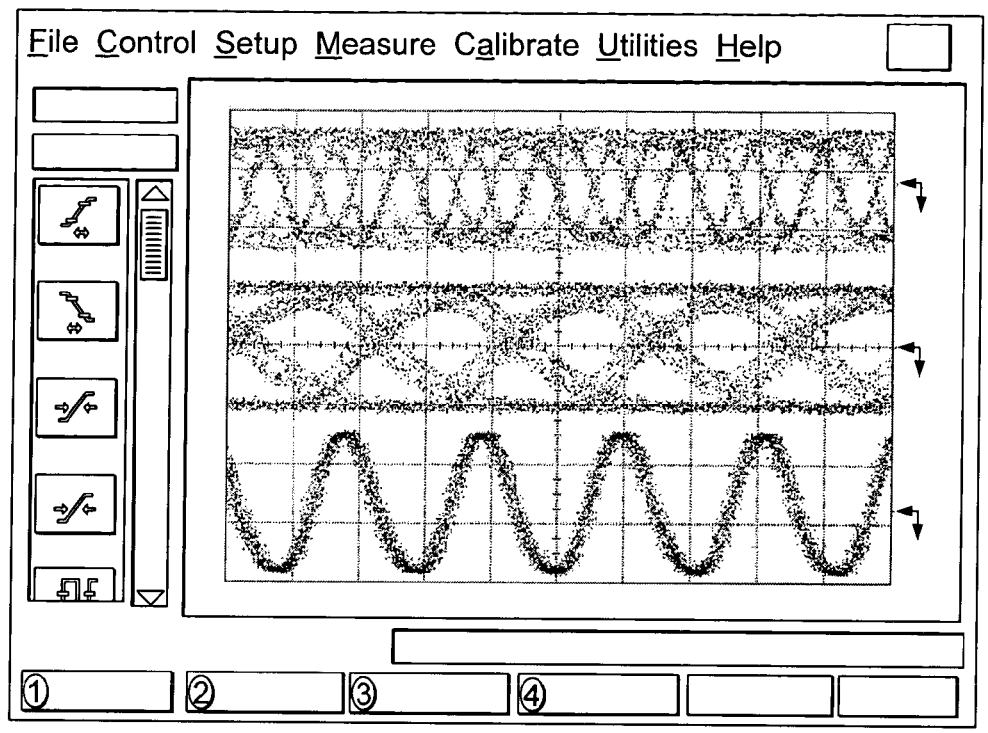
FIG. 7A is a graph that depicts the clock and data recovery circuit input and output waveforms under locked condition in response to a pseudo-random sequence of length $2^{31}-1$.
Figure 7B:
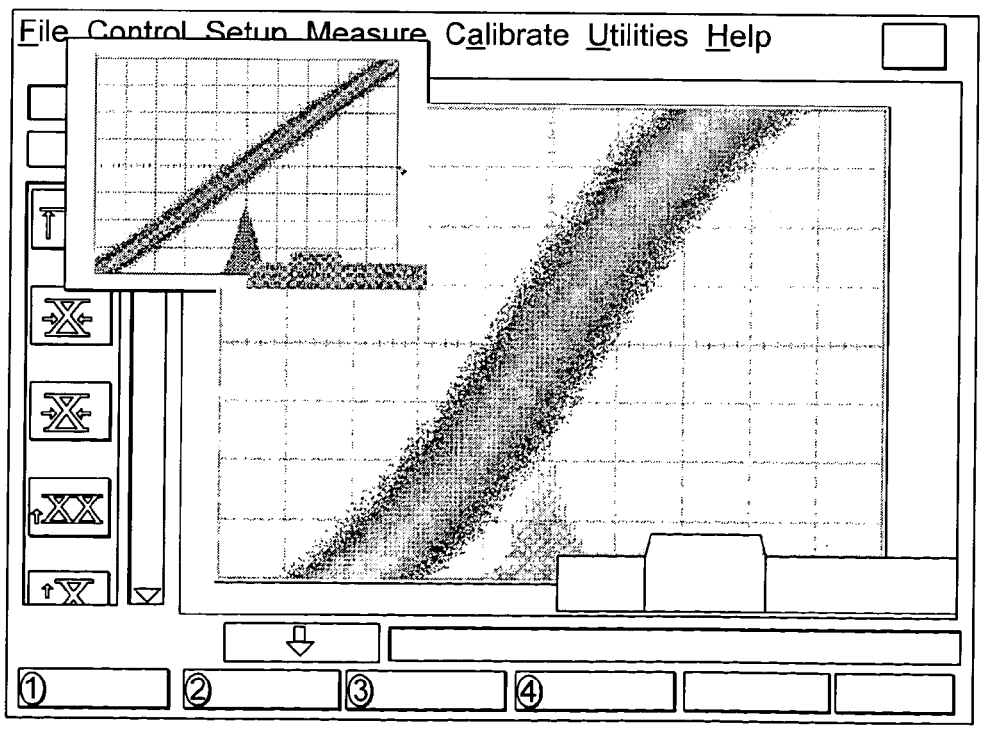
FIG. 7B is a graph that shows the recovered clock, suggesting an rms jitter of 1.756 ps and a peak-to-peak jitter of 9.67 ps.

FIG. 7A depicts the CDR circuit 10 input and output waveforms under locked condition in response to a pseudo-random sequence of length $2^{31}$-1. The de-multiplexed data experiences some inter-symbol interference (ISI), but if further de-multiplexing is included on the same chip, the ISI can be tolerated. FIG. 7B shows the recovered clock, suggesting an rms jitter of 1.756 ps and a peak-to-peak jitter of 9.67 ps.

However, as shown in the inset, the oscilloscope itself suffers from rms and peak-to-peak jitters of 1.508 ps and 8.89 ps, respectively. Thus, the CDR circuit 10 output contains a jitter of 0.9 ps,rms and at most 9.67 ps,pp. (It is unclear whether and how the peak-to-peak values can be subtracted.)

The performance of this work and some other previously-published CDR circuits is summarized in Table 1. (The power dissipation noted here for the design in [2] excludes their limiting amplifier and frequency detector contribution and was obtained through private communication with M. Reinhold.)

|  | Reference [1] | Reference [2] | Reference [6] | Present Invention |
|---|---|---|---|---|
| Input Data Rate | 40-Gb/s | 40-Gb/s | 10-Gb/s | 40-Gb/s |
| Output Data Rate | 2 × 20-Gb/s | 4 × 10-Gb/s | 2 × 5-Gb/s | 4 × 10-Gb/s |
| Rec. Clock Jitter | 0.8 ps, rms | 0.7 ps, rms | 1.2 ps, rms | 0.9 ps, rms |
| Power Dissipation | 1.6 W | 4.3 W | 360 mW | 144 mW |
| Supply Voltage | 5 V | 5 V | 1.8 V | 2 V |
| Area | 0.9 mm × 0.9 mm | 3 mm × 3 mm | 1.9 mm × 1.5 mm | 1.0 mm × 1.4 mm |
| Technology | 50-GHz Bipolar (uses external VCO and divider) | 72-GHz SiGe | 0.18-μm CMOS | 0.18-μm CMOS |

REFERENCES

The following references are incorporated by reference herein:

[1] M. Wurzer et al, "A 40-Gb/s Integrated Clock and Data Recovery Circuit in a 50-GHz $f_T$ Silicon Bipolar Technology," IEEE Journal of Solid-State Circuits, vol. 34, pp. 1320-1324, September 1999.

[2] M. Reinhold et al, "A Fully Integrated 40-Gb/s Clock and Data Recovery IC with 1:4 DEMUX in SiGe technology," IEEE Journal of Solid-State Circuits, vol. 36, pp. 1937-1945, December 2001.

[3] J. Cao et al, "OC-192 Receiver in Standard 0.18 µm CMOS," ISSCC Dig. Tech. Papers, pp. 250-251, February 2002.

[4] J. Kim and B. Kim, "A Low Phase-Noise CMOS LC Oscillator with a Ring Structure," ISSCC Dig. of Tech. Papers, pp. 430-431, February 2000.

[5] T. P. Liu, "A 6.5-GHz Monolithic CMOS Voltage-Controlled Oscillator," ISSCC Dig. of Tech. Papers, pp. 404-405, February 1999.

[6] J. E. Rogers and J. R. Long, "A 10-Gb/s CDR/DEMUX with LC Delay Line VCO in 0.18 µm CMOS," ISSCC Dig. of Tech. Papers, pp. 254-255, February 2002.

[7] J. Savoj and B. Razavi, "A 10-Gb/s CMOS Clock and Data Recovery Circuit with Frequency Detection," ISSCC Dig. Tech. Papers, pp. 78-79, February 2001.

[8] M. Danesh et al., "A Q-Factor Enhancement Technique for MMIC Inductors," Proc. IEEE Radio Frequency Integrated Circuits Symp., pp. 217-220, April 1998.

[9] A. Hajimiri and T. H. Lee, "A General Theory of Phase Noise in Electrical Oscillators," IEEE Journal of Solid-State Circuits, pp. 179-194, February 1998.

[10] J. D. H. Alexander, "Clock Recovery from Random Binary Data," Electronics Letters, vol. 11, pp. 541-542, October 1975.

[11] B. Razavi et al, "Design Techniques for Low-Voltage High-Speed Digital Bipolar Circuits," IEEE Journal of Solid-State Circuits, pp. 332-9, March 1994.

Conclusion

This concludes the description of the preferred embodiment of the invention. The following describes some alternative embodiments for accomplishing the present invention.

For example, the present invention could be used with many types of circuits, and not just those described herein. Moreover, any number of different components or different configurations of components could be used without departing from the scope of the present invention. Finally, any number of input data signals, phase offset clock signals and de-multiplexed output data signals could be generated by the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A clock and data recovery circuit, comprising:
    (a) a multi-phase voltage-controlled oscillator (VCO) for accepting a control signal and for changing a frequency of a 10 GHz clock signal output from the voltage-controlled oscillator in response thereto, wherein the voltage-controlled oscillator outputs a plurality of phases of the 10 GHz clock signal;
    (b) a phase detector (PD) for sampling a 40 Gb/s input data signal using the 10 GHz clock signal received from the voltage-controlled oscillator and generating four 10 Gb/s output data signals in response thereto, wherein the 40 Gb/s input data signal is re-timed and de-multiplexed into the 10 Gb/s output data signals by the phase detector using half-quadrature phase offsets of the 10 GHz clock signal, such that each of the 10 Gb/s output data signals detects an edge or transition in the 40 Gb/s input data signal and whether the edge or transition is early or late with respect to its corresponding half-quadrature phase offset of the 10 GHz clock signal;
    (c) a voltage-to-current (V/I) converter for converting the 10 Gb/s output data signals from the phase detector to a control current; and
    (d) a loop filter (LPF) for integrating the control current from the Voltage-to-Current Converter and for outputting the control signal to the voltage-controlled oscillator in response thereto;
    (e) wherein the multi-phase voltage-controlled oscillator, phase detector, voltage-to-current converter and loop biter are implemented in complementary metal-oxide semiconductor (CMOS).

2. The clock and data recovery circuit of claim 1, wherein the circuit accepts a single input data signal, and re-times and de-multiplexes the input data signal to a plurality of output data signals.

3. The clock and data recovery circuit of claim 1, wherein the phase detector uses half-quadrature phases of the clock signal provided by the voltage-controlled oscillator to sample the input data signal, thereby detecting the edges or transitions in the input data signal, and determining whether the clock signal is early or late.

4. The clock and data recovery circuit of claim 1, wherein the phase detector employs a plurality of flip-flops to strobe the input data signal at intervals based on the plurality of phases of the clack signal received from the voltage-controlled oscillator.

5. The clock and data recovery circuit of claim 1, wherein the phase detector compares every two adjacent or consecutive samples stored by two adjacent or consecutive flip-flops by means of an associated XOR gate, which generates a net output current if the two adjacent or consecutive samples are unequal, thereby indicating that an edge or transition has occurred in the input data signal.

6. The clock and data recovery circuit of claim 1, wherein the phase detector uses both leading and trailing edges of the phases of the clock signal to sample the input data signal, in order to detect the edges or transitions in the input data signal.

7. The clock and data recovery circuit of claim 1, wherein the voltage-controlled oscillator is based on differential stimulus of a closed-loop transmission line at equally-spaced points that sustains a phase separation of 180° at diagonally-opposite nodes, providing 45° phase steps in between for the clock signal.

8. The clock and data recovery circuit of claim 7, wherein the voltage-controlled oscillator's oscillation frequency is uniquely given by a travel time of a wave around the loop.

9. The clock and data recovery circuit of claim 7, wherein inductor elements of the voltage-controlled oscillator are grouped into differential structures and $-G_m$ cells are placed in dose proximity to the nodes of the voltage-controlled oscillator.

10. The clock and data recovery circuit of claim 7, wherein each differential port of the voltage-controlled oscillator is buffered by an inductively-loaded differential pair of switches.

11. A method of clock and data recovery, comprising
    (a) accepting a control signal into a multi-phase voltage-controlled oscillator (VCO) and changing a frequency of a 10 GHz clock signal output from the voltage-controlled oscillator in response thereto, wherein the voltage-controlled oscillator outputs a plurality of phases of the 10 GHz clock signal;

(b) sampling a 40 Gb/s input data signal at a phase detector (PD) using the 10 GHz clock signal received from the voltage-controlled oscillator and generating four 10 Gb/s output data signals in response thereto, wherein the 40 Gb/s input data signal is re-timed and de-multiplexed into the 10 Gb/s output data signals by the phase detector using half-quadrature phase offsets of the 10 GHz clock signal, such that each of the 10 Gb/s output data signals detects an edge or transition in the 40 Gb/s input data signal and whether the edge or transition is early or late with respect to its corresponding half-quadrature phase offset of the 10 GHz clock signal;

(c) converting the 10 Gb/s output data signals from the phase detector to a control current at a voltage-to-current (V/I) converter; and (d) integrating the control currant from the Voltage-to-Current Converter at a loop filter (LPF) and outputting the control signal to the voltage-controlled oscillator in response thereto;

(e) wherein the multi-phase voltage-controlled oscillator, phase detector, voltage-to-current converter and loop filter are implemented in complementary metal-oxide semiconductor (CMOS).

12. The method of clock and data recovery of claim 11, further comprising accepting a single input data signal, and re-timing and de-multiplexing the input data signal to a plurality of output data signals.

13. The method of clock and data recovery of claim 11, wherein the phase detector uses half-quadrature phases of the clock signal provided by the voltage-controlled oscillator to sample the input data signal, thereby detecting the edges or transitions in the input data signal, and determining whether the clock signal is early or late.

14. The method of clock and data recovery of claim 11, wherein the phase detector employs a plurality of flip-flops to strobe the input data signal at intervals based on the plurality of phases of the clock signal received from the voltage-controlled oscillator.

15. The method of clock and data recovery of claim 11, wherein the phase detector compares every two adjacent or consecutive samples stored by two adjacent or consecutive flip-flops by means of an associated XOR gate, which generates a net output current if the two adjacent or consecutive samples are unequal, thereby indicating that an edge or transition has occurred in the input data signal.

16. The method of clock and data recovery of claim 11, wherein the phase detector uses both leading and trailing edges of the phases of the clock signal to sample the input data signal, in order to detect the edges or transitions in the input data signal.

17. The method of clock and data recovery of claim 11, wherein the voltage-controlled oscillator is based on differential stimulus of a closed-loop transmission line at equally-spaced points that sustains a phase separation of 180° at diagonally-opposite nodes, providing 45° phase steps in between for the clock signal.

18. The method of clock and data recovery of claim 17, wherein the voltage-controlled oscillator's oscillation frequency is uniquely given by a travel time of a wave around the loop.

19. The method of clock and data recovery of claim 17, wherein inductor elements of the voltage-controlled oscillator are grouped into differential structures and $-G_m$ cells are placed in close proximity to the nodes of the voltage-controlled Oscillator.

20. The method of clock and data recovery of claim 17, wherein each differential port of the voltage-controlled oscillator is buffered by an inductively-loaded differential pair of switches.

* * * * *

UNITED STATES PATENT AND TRADEMARK OFFICE
CERTIFICATE OF CORRECTION

PATENT NO. : 7,286,625 B2  Page 1 of 1
APPLICATION NO. : 10/616021
DATED : October 23, 2007
INVENTOR(S) : Lee et al.

It is certified that error appears in the above-identified patent and that said Letters Patent is hereby corrected as shown below:

Column 8:

Claim 4, line 31, please delete "clack" and insert --clock--.

Signed and Sealed this

Twenty-sixth Day of October, 2010

David J. Kappos
*Director of the United States Patent and Trademark Office*